(12) United States Patent
Walczak

(10) Patent No.: US 6,988,543 B2
(45) Date of Patent: Jan. 24, 2006

(54) ANNULAR COLD PLATE WITH REFLEXIVE CHANNELS

(75) Inventor: Walter S. Walczak, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/806,298

(22) Filed: Mar. 22, 2004

(65) Prior Publication Data

US 2005/0205246 A1 Sep. 22, 2005

(51) Int. Cl.
*F28F 3/12* (2006.01)
(52) U.S. Cl. .................................. 165/168; 165/80.5
(58) Field of Classification Search ............... 165/168, 165/170, 80.4, 80.5
See application file for complete search history.

(56) References Cited

U.S. PATENT DOCUMENTS

| 2,362,911 | A | * | 11/1944 | Litton ........................ 165/168 |
| 4,443,172 | A | * | 4/1984 | Riley et al. .................. 425/112 |
| 4,592,415 | A | * | 6/1986 | Friedman .................... 165/80.4 |
| 4,859,304 | A | * | 8/1989 | Cathey et al. ......... 204/298.31 |
| 5,200,232 | A | * | 4/1993 | Tappan et al. .............. 427/569 |
| 5,906,683 | A | * | 5/1999 | Chen et al. .................. 165/168 |
| 5,983,997 | A | | 11/1999 | Hou |
| 6,053,238 | A | * | 4/2000 | Goth et al. ................. 165/80.4 |
| 6,058,010 | A | * | 5/2000 | Schmidt et al. ............. 361/689 |
| 6,379,466 | B1 | * | 4/2002 | Sahin et al. ................. 165/168 |
| 6,457,515 | B1 | * | 10/2002 | Vafai et al. ................. 165/80.4 |
| 6,634,421 | B2 | | 10/2003 | Ognibene et al. |
| 2001/0045269 | A1 | * | 11/2001 | Yamada ...................... 165/80.4 |

OTHER PUBLICATIONS

Comparison of Laser and Emission Based Optical Probe Techniques. Lo, William et al., date unknown, Schlumberger Technology, San Jose, CA.

* cited by examiner

*Primary Examiner*—Teresa J. Walberg
(74) *Attorney, Agent, or Firm*—Schwabe, Williamson & Wyatt, P.C.

(57) ABSTRACT

An annular cold plate with reflexive channels, and systems having such cold plates, are described herein.

20 Claims, 3 Drawing Sheets

ANNULAR COLD PLATE WITH REFLEXIVE CHANNELS

FIELD OF THE INVENTION

The present invention relates generally to the field of integrated circuits, in particular, probing of integrated circuits.

BACKGROUND OF THE INVENTION

Optical probes are often employed to probe integrated circuits. Typically, an integrated circuit to be probed is placed in a die plate, which in turn is mated with an annular cold plate to remove heat generated by the integrated circuit during probing.

As the operating speed of integrated circuits continues to increase, so does the amount of heat generated during probing, and needs to be removed. Experience has shown that the current generation of annular cold plate is unlikely to be able to meet the heat removal requirement of the next generation of high speed integrated circuits.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Illustrative embodiments of the present invention include, but are not limited to an annular cold plate, and an integrated circuit (IC) probing system having an optical probe and such an annular cold plate.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials, and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Terms such as "above", "below", "side" and so forth will be used in the description to follow. However, these are relative terms, used for ease of understanding. Whether an element or feature is "above", "beneath" or at the "side" of another element or feature depends on a particular point of view. Thus, the descriptions are not to be read as restrictive on the invention.

Figure 1:
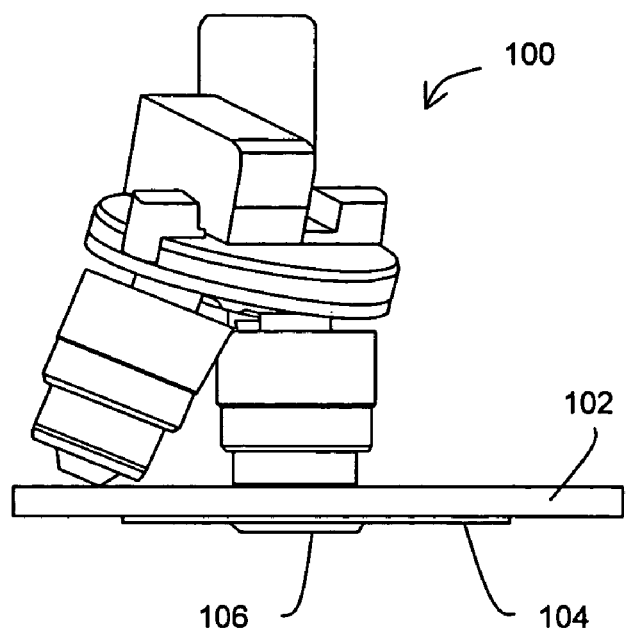
FIG. 1 illustrates a simplified side view of an optical probe for probing a die held by a die plate mated with an annular cold plate of one embodiment of the present invention.
Figure 2:
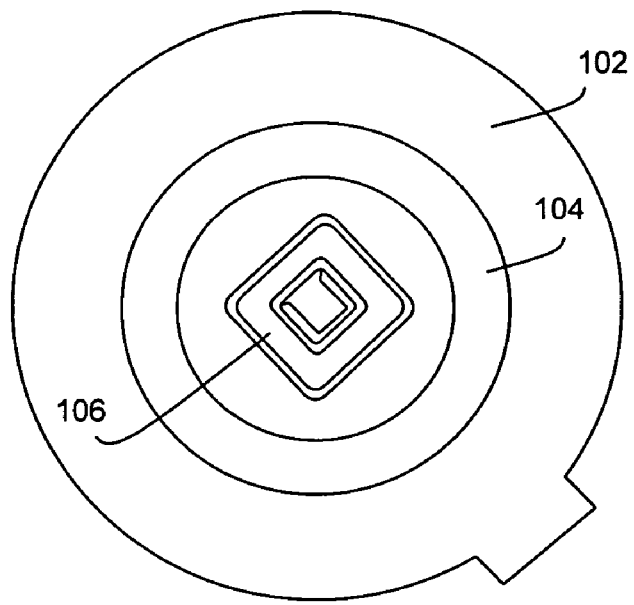
FIG. 2 illustrates a simplified top view of the annular cold plate, the die plate and the die of FIG. 1.
Figure 3:
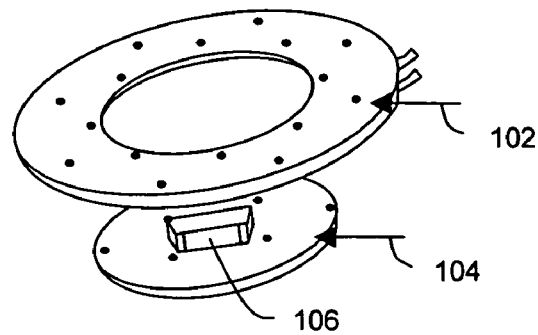
FIG. 3 illustrates a simplified exploded view of the annular cold plate, the die plate and the die of FIG. 1.

Referring now to FIGS. 1–3, wherein a simplified cross section view of an optical probe for probing a die secured by a die plate mated with an annular cold plate of an embodiment of the present invention, a top view, and an exploded view of the die and annular cold plates without the optical probe, are shown respectively. As illustrated, die 106 is attached to die plate 104, which in turn is mated with cold plate 102, resulting in die plate 104 and die 106 being disposed substantially at the center of annular cold plate 102. Together, the assembly, i.e. annular cold plate 102 mated with die plate 104 having die 106, is positioned "underneath" optical probe 100 allowing die 106 to be probed.

Die 106 may be interfaced with die plate 104 in any one of a number of techniques. Similarly, die plate 104 may be mated with annular cold plate 102 in any one of a number of techniques.

Continuing to refer to FIGS. 1–3, optical probe 100 may include one or more light sources capable of selectively producing lights (e.g. laser lights) in various wavelength bands, and a variety of optical arrangements to facilitate focusing the outputted lights onto the die for performing various die probing. Different die plates 104, each designed for a different silicon product family, may be mated with annular cold plate 102, allowing different dies of the same or different families to be probed.

In each case, annular cold plate 102 facilitates cooling for the die being probed, i.e. removal of the heat generated by the die during probing. As will be described in more detail below, in various embodiments, annular cold plate 102 is endowed with various embodiments of a novel coolant fluid channel arrangement, resulting in annular cold plate 102 being more efficient and/or effective as a cooling agent for a die being probed.

As will be readily apparent from the description to follow, except for the novel coolant fluid channel arrangement, annular cold plate 102 may otherwise be any one of a wide range of such element, assuming any one of a wide range of dimensions, and/or being constituted using any one of a wide range of thermally conductive materials, including but are not limited to copper, aluminum, silver and so forth. Likewise, annular cold plate 102 may be used to facilitate probing of a wide range of dies, e.g. a microprocessor, using a wide range of optical probes.

Figure 4A:
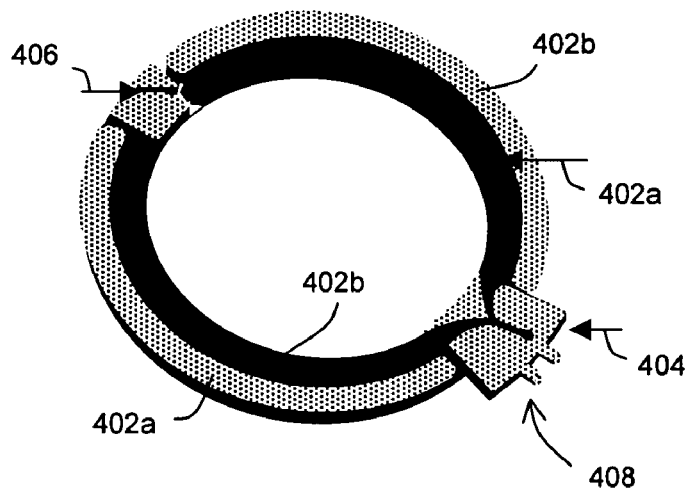
FIGS. 4a–4b illustrate simplified top and bottom exposed views of the coolant fluid channels of the annular cold plate, in accordance with one embodiment.
Figure 4B:
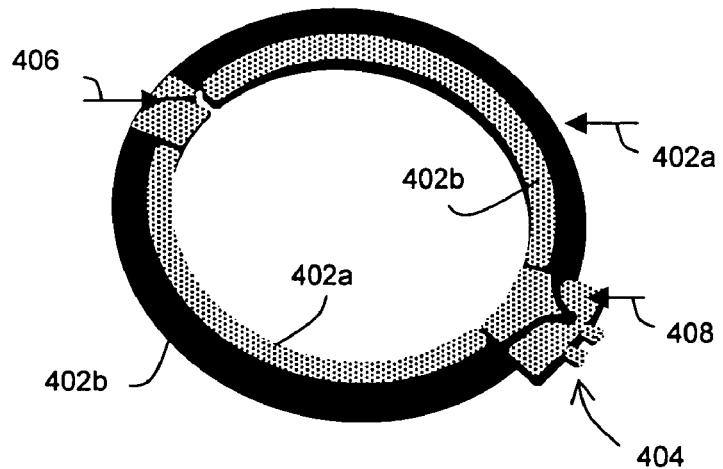

FIGS. 4a–4b illustrate simplified top and bottom exposed views of the novel coolant fluid channel arrangement of the present invention, in accordance with one embodiment. Note that references to the views as top and bottom exposed views are made merely for ease of understanding, as the coolant fluid channels may be exposed with either surface of annular cold plate 102 being considered as the 'top' or 'bottom' surface.

For the illustrated embodiment, annular cold plate 102 includes two circumfluent coolant fluid channels

402a–402b. Circumfluent coolant fluid channel 402a traverses from inlet 404 in a counterclockwise direction to outlet 408, whereas circumfluent coolant fluid channel 402b traverses from inlet 404 in a complementary clockwise direction to outlet 408. The two circumfluent coolant fluid channels 402a–402b are reflexive, i.e. a later (outlet end) portion of each of the two circumfluent coolant fluid channels 402a–402b turns on (i.e. a reflection of) an earlier (inlet end) portion. More specifically, for the illustrated embodiment, the two circumfluent coolant fluid channels 402a–402b cross each other at location 406, which for the embodiment is approximately at the mid-point of each of the channels, located at the opposite side of inlet 404 and outlet 408.

For ease of description, all or part of the portion closer to inlet 404, before crossing 406, will be generally referred to as the inlet portion or inlet end of a channel, whereas all or part of the portion closer to outlet 408, after crossing 406, will be generally referred to as the outlet portion or outlet end of the channel.

In various embodiments, during probing, coolant fluid substantially cooler than the ambient environment is provided to channels 402a–402b through inlet 404. In various embodiments, the coolant fluid, relative to the heat output of die 106, is sufficiently cool, such that the coolant fluid remains cooler than the ambient environment when it flows through outlet ends of channels 402a–402b towards outlet 408. Accordingly, the configuration allows the outlet end of a channel to insulate the inlet end of the other channel, from the inlet end's "side", making annular cold plate 102 a more efficient/effective cooling arrangement for a die being probed.

In various embodiments, the coolant fluid, in addition to being sufficiently cool as earlier described, is also sufficiently cool to provide a substantially equal temperature at the circumference of die plate 104.

In various embodiments, the coolant fluid is provided at a temperature in the range of −80° C. and −140° C. for probing dies with thermal output capacities that raise the temperature of the coolant fluid to no higher than −5° C. When the coolant fluid exits channels 402a–402b at outlet 408. In general, any coolant fluid which temperature, notwithstanding the amount of heat outputted by the die, can be consistently maintained below the ambient, may be used. An example of a likely suitable coolant fluid is liquid nitrogen. In various embodiments, liquid nitrogen just at the phase change, which temperature is about −196° C., is used. The liquid nitrogen in a gas state may be combined with refrigerated air at about −90° C., to form a combined gas state at about −140° C.

In various embodiments, annular cold plate 102 has a thickness of about 0.5 inches.

In alternate embodiments, annular cold plate 102 may include more than two circumfluent coolant fluid channels. A pair of channels may cross in another location beside the "mid-point" location of the earlier described embodiment. Further, the inlet and outlet ends of the circumfluent coolant fluid channels may be formed with different materials. In particular, the inlet end of a circumfluent coolant fluid channel may be formed with thermally conductive material, while the outlet end of the circumfluent coolant fluid channel may be formed with a lower thermal conductive material or even a thermal insulator. The circumfluent coolant fluid channels may have individual inlets and/or individual outlets as opposed to the common "splitting" inlet 404 and the common combining outlet 408 of the earlier described embodiment. Annular cold plate 102 may also be thicker or thinner. In other words, in alternate embodiments, many modifications may be made without departing from the self-insulating essence of the coolant fluid channels of the earlier described embodiment.

Figure 5A:
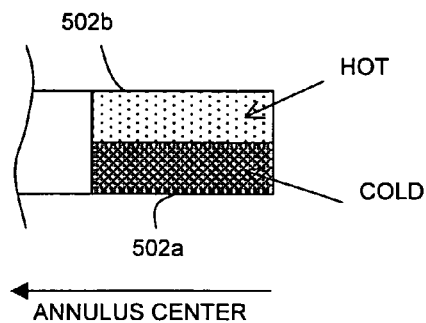
FIGS. 5a–5b illustrate alternate relative dispositions of the coolant fluid channels, in accordance with other embodiments.
Figure 5B:
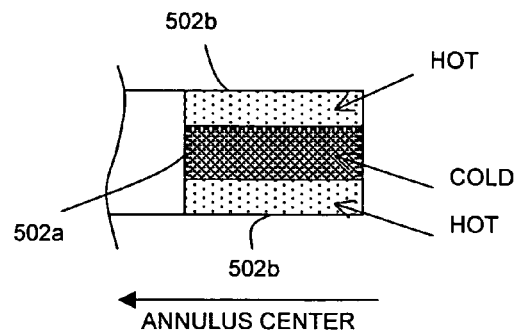

FIGS. 5a–5b illustrate two example modifications to the earlier described embodiment. More specifically, FIGS. 5a–5b illustrate a number of alternate relative disposition of the coolant fluid channels, in accordance with a number of alternate embodiments. For the embodiment of FIG. 5a, in lieu of the side-by-side relative disposition of the earlier described embodiment, channels 402a–402b are disposed top and bottom of each other, resulting in the outlet end of a channel being on "top" of the inlet end of another channel, insulating the inlet end from its "top". For the embodiment of FIG. 5b, the outlet end of a channel is further split into two portions with one portion disposed on "top" of the inlet end of the other channel, and the other portion disposed "underneath" the inlet end of the other channel, insulating the inlet end from its "bottom" as well as from its "top". Thus, unlike the earlier described embodiment where the annular cold plate and its coolant fluid channels are co-planar, in these embodiments, the annular cold plate occupies one plane, and the coolant fluid channels occupy another plane, orthogonal to the plane occupied by the annular cold plate.

Figure 6:
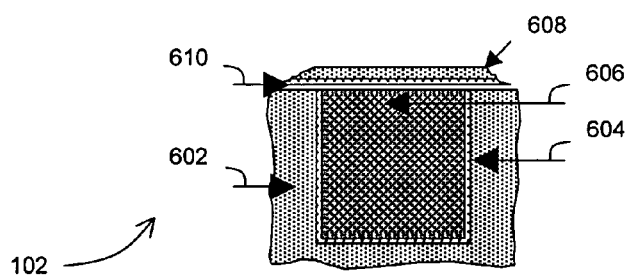
FIG. 6 illustrates a simplified cross sectional view of a coolant fluid channel in accordance with one embodiment.

FIG. 6 illustrates yet another example modification of the earlier described embodiments. More specifically, FIG. 6 illustrates a cross sectional view of a coolant fluid channel in accordance with an alternate embodiment. For the embodiment, circumfluent coolant fluid channel 402a/402b is formed by first carving the circumfluent channel from a metal piece. The walls 602 of a carved channel may be lined with a thermally conductive braze-bonding 604. The lined channel may also be filled with a thermally conductive open cell metallic foam 606 and another metal piece may cap the walls 602 as a roof (or floor) 608 through another braze bonding 610. Each of the metal pieces, brazed bonding 604/610, metal foam 606 (a form of surface area enhancement) and roof/floor 608 may be made of thermally conductive materials such as, but not limited to, copper, aluminum, silver, and so forth. However, in alternate embodiments, bonding 604/610 may be accomplished with another process. Further, in alternate embodiments, the wall 602 may be "hybrid" with the inlet region of wall 602 being made of thermally conductive material, while the outlet region is made of thermal insulator. The thermally non-conductive portion may be secured using adhesives, e.g. silicone or epoxy.

Figure 7A:
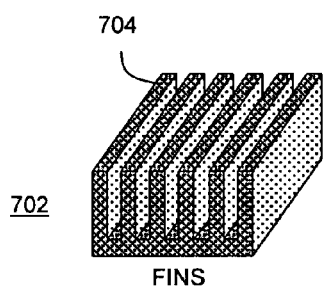
FIGS. 7a–7b illustrate alternate surface area enhancement features, in accordance with other embodiments.
Figure 7B:
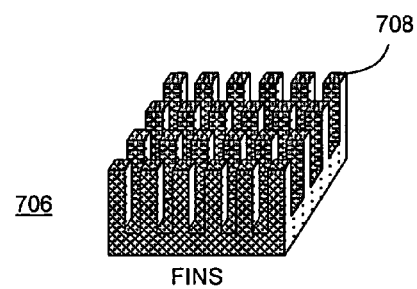

FIGS. 7a–7b illustrate yet two other example modifications to the earlier described embodiments. More specifically, FIGS. 7a–7b illustrate perspective views of two example surface area enhancement configurations, which may be used in lieu of the earlier described metallic foam filling, in accordance with two alternate embodiments. Surface area enhancement configuration 702 of FIG. 7a includes a number of surface area enhancing fins 704, whereas surface area enhancement configuration 706 of FIG. 7b includes a number of surface area enhancing pins 708. The number and dimensions of the surface area enhancing fins or pins may be tailored to meet a particular application, that is the input temperature of the coolant fluid, the amount of heat produced by a particular die that needs to be dissipated during probing, and so forth. Similarly, the surface area enhancements materials may be secured to channel 402a/402b with thermal conductive adhesives.

Thus, a novel annular cold plate and its application have been described. Although specific embodiments have been illustrated and described herein, it will be appreciated by those of ordinary skill in the art that a wide variety of alternate and/or equivalent implementations may be substituted for the specific embodiments shown and described, without departing from the scope of the present invention. This application is intended to cover any adaptations or variations of the embodiments discussed herein. Therefore, it is manifestly intended that this invention be limited only by the claims and the equivalents thereof.

What is claimed is:

1. An apparatus comprising:
   an annular cold plate;
   a first circumfluent channel disposed within the annular cold plate traversing from a first inlet along a first direction to a first outlet to facilitate flowing of a first coolant fluid to remove heat from a heat source substantially disposed at a center of the annular plate; and
   a second circumfluent channel disposed within the annular cold plate traversing from a second inlet along a second direction to a second outlet to facilitate flowing of a second coolant fluid to remove heat from the heat source, the second circumfluent channel being reflexively disposed relative to the first circumfluent channel with the two circumfluent channels crossing each other at least once, the second inlet being proximally disposed relative to the first inlet and having a first relative disposition relationship, and the second outlet proximally disposed relative to the first outlet and having a second relative disposition relationship that is a reflection of the first relative disposition relationship.

2. The apparatus of claim 1, wherein the second circumfluent channel is further disposed relatively to the first circumfluent channel with at least a first portion of the first circumfluent channel at the first outlet end of the first circumfluent channel insulating a second portion of the second circumfluent channel at the second inlet end of the second circumfluent channel.

3. The apparatus of claim 2, wherein the second circumfluent channel is further disposed relatively to the first circumfluent channel with a third portion of the second circumfluent channel at the second outlet end of the second circumfluent channel insulating a fourth portion of the first circumfluent channel at the first inlet end of the first circumfluent channel.

4. The apparatus of claim 1, wherein the first and second circumfluent channels cross each other at least one time.

5. The apparatus of claim 1, wherein the first and second inlets are one of the same flow splitting inlet, and the first and second coolant fluids are first and second portions of the same coolant fluid.

6. The apparatus of claim 1, wherein the first and second outlets are one of the same flow combining outlet, and the first and second coolant fluids are first and second portions of the same coolant fluid.

7. The apparatus of claim 1, wherein the annular cold plate, the first and second circumfluent channels are all co-planar, having substantially the same height.

8. The apparatus of claim 7, wherein said height is about 0.5 inches.

9. The apparatus of claim 1, wherein the annular cold plate occupies a first plane, and the first and second circumfluent channels occupy a second plane orthogonal to the first plane.

10. The apparatus of claim 1, wherein the first direction is a selected one of a clockwise and a counter-clockwise direction, and the second direction is an opposite, complementary direction.

11. The apparatus of claim 1, wherein at least one of the first and second circumfluent channels is at least partially filled with a thermally conductive surface enhancing material.

12. The apparatus of claim 1, wherein at least one of the first and second circumfluent channels is at least partially filled with a thermally conductive surface enhancing material having geometric features selected from a group consisting of pins and fins.

13. The apparatus of claim 1, wherein an outlet end of at least one of the first and second circumfluent channels is made of a selected one of lower thermal conductivity material and thermal insulator.

14. A method comprising:
    providing a coolant fluid to a first inlet of a first circumfluent channel, and a second inlet of a second circumfluent channel of an annular cold plate to remove heat from a heat source substantially disposed at a center of the annular cold plate, the first and second inlets being proximally disposed relative to each other and having a first relative disposition relationship; and
    reflexively flowing a first and a second portion of the coolant fluid through the first and second circumfluent channels along a first and a second direction to a first and a second outlet of the first and second circumfluent channels, respectively, the first and second circumfluent channels crossing each other at least once, and the first and second outlets being proximally disposed relative to each other and having a second relative disposition relationship that is a reflection of the first relative disposition relationship.

15. The method of claim 14, wherein said providing comprises providing the coolant fluid at a common inlet of the annular cold plate, and the method further comprises splitting the coolant fluid into said first and second portions for the first and second circumfluent channels, respectively.

16. The method of claim 14, where said flowing comprises flowing the first portion of the coolant fluid through the first circumfluent channel in a selected one of a clockwise and a counter-clockwise direction, and flowing the second portion of the coolant fluid through the second circumfluent channel in a complementary opposite direction.

17. The method of claim 14, wherein said flowing comprises at least one of flowing the first portion of the coolant fluid through a first conductive filling within the first circumfluent channel, and flowing the second portion of the coolant fluid through a second conductive filling within the second circumfluent channel.

18. The method of claim 14, wherein said flowing comprises at least one of flowing the first portion of the coolant fluid through a first conductive surface area enhanced filling within the first circumfluent channel, and flowing the second portion of the coolant fluid through a second conductive surface area enhanced filling within the second circumfluent channel.

19. The method of claim 14, wherein the method further comprises recombining the first and second portions of the coolant fluid after flowing the first and second portions through the first and second circumfluent channels respectively, and outputting the re-combined coolant fluid through a common output of the annular cold plate.

20. The method of claim 14, wherein the coolant fluid is provided to the annular cold plate at a first temperature that is sufficiently below an ambient temperature, such that the coolant fluid exits the annular cold plate at a second temperature, higher than the first temperature, but still below the ambient temperature.

* * * * *

UNITED STATES PATENT AND TRADEMARK OFFICE
CERTIFICATE OF CORRECTION

PATENT NO. : 6,988,543 B2
APPLICATION NO. : 10/806298
DATED : January 24, 2006
INVENTOR(S) : Walter S. Walczak It is certified that error appears in the above-identified patent and that said Letters Patent is hereby corrected as shown below:

Column 3
Lines 11, "...location 406,..." should read --...crossing 406,...--.

Column 4
Line 11, "...channels 402a-402b..." should read --...channels 502a-502b...--.
Line 30, "...channel 402a/402b..." should read --...channels 402a/402b...--.
Lines 64-65, "...channel 402a/402..." should read --...channels 402a/402b...--.

Signed and Sealed this

Seventeenth Day of April, 2007

JON W. DUDAS
*Director of the United States Patent and Trademark Office*